(12) United States Patent
Joshi

(10) Patent No.: US 8,981,556 B2
(45) Date of Patent: Mar. 17, 2015

(54) JET IMPINGEMENT COOLING APPARATUSES HAVING NON-UNIFORM JET ORIFICE SIZES

(71) Applicant: Toyota Motor Engineering & Manufacturing North America, Inc., Erlanger, KY (US)

(72) Inventor: Shailesh N. Joshi, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 51 days.

(21) Appl. No.: 13/847,186

(22) Filed: Mar. 19, 2013

(65) Prior Publication Data

US 2014/0284787 A1    Sep. 25, 2014

(51) Int. Cl.
    *H01L 23/34*    (2006.01)
    *H01L 23/473*    (2006.01)

(52) U.S. Cl.
    CPC ..... *H01L 23/4735* (2013.01); *H01L 2924/0002* (2013.01)
    USPC ............................. 257/714; 257/716; 361/699

(58) Field of Classification Search
    USPC ................................... 257/714, 716; 361/699
    See application file for complete search history.

(56) References Cited

U.S. PATENT DOCUMENTS

| | | | |
|---|---|---|---|
| 4,583,582 | A | 4/1986 | Grossman |
| 5,067,047 | A | 11/1991 | Azar |
| 5,402,004 | A | 3/1995 | Ozmat |
| 5,959,351 | A * | 9/1999 | Sasaki et al. ............. 257/714 |
| 6,123,145 | A | 9/2000 | Giezer et al. |
| 6,952,346 | B2 | 10/2005 | Tilton et al. |
| 6,986,382 | B2 | 1/2006 | Upadhya et al. |
| 6,988,535 | B2 | 1/2006 | Upadhya et al. |
| 7,277,283 | B2 | 10/2007 | Campbell et al. |

(Continued)

FOREIGN PATENT DOCUMENTS

| | | |
|---|---|---|
| JP | 10121110 | 5/1998 |
| WO | 98/44307 | 10/1996 |
| WO | WO2005029555 | 3/2005 |

OTHER PUBLICATIONS

Brunschwiler, T., et al. "Direct Liquid Jet-Impingement Cooling With Micron-Sized Nozzle Array and Distributed Return Architecture. Proc. Of the Tenth Intersociety Conference on Thermal and Thermomechanical Phenomena in Electronics Systems", San Diego, CA, 2006: 196-203.

(Continued)

*Primary Examiner* — Phat X Cao
(74) *Attorney, Agent, or Firm* — Dinsmore & Shohl LLP

(57) ABSTRACT

Jet impingement cooling apparatuses having non-uniformly sized jet orifices for producing an array of impingement jets that impinge a target surface are disclosed. In one embodiment, a cooling apparatus includes at least one fluid inlet channel, at least one fluid outlet channel, a target surface, and a jet orifice surface that is offset from the target surface. The jet orifice surface includes an array of jet orifices fluidly coupled to the at least one fluid inlet channel, wherein each individual jet orifice of the array of jet orifices has an area corresponding to a distance of the individual jet orifice to the at least one fluid outlet channel such that individual jet orifices closer to the at least one fluid outlet have an area that is smaller than individual jet orifices further from the at least one fluid outlet. Power electronics modules are also disclosed.

15 Claims, 15 Drawing Sheets

(56) References Cited

U.S. PATENT DOCUMENTS

| | | |
|---|---|---|
| 7,375,962 B2 | 5/2008 | Campbell et al. |
| 7,511,957 B2 | 3/2009 | Campbell et al. |
| 7,530,778 B2 | 5/2009 | Yassour et al. |
| 7,571,618 B2 | 8/2009 | Dessiatoun |
| 7,597,135 B2 | 10/2009 | Ghosh et al. |
| 7,639,030 B2 | 12/2009 | Wadell |
| 7,762,314 B2 | 7/2010 | Campbell et al. |
| 7,841,843 B2 | 11/2010 | Cho et al. |
| 7,885,074 B2 | 2/2011 | Campbell et al. |
| 7,921,664 B2 | 4/2011 | Rini et al. |
| 7,942,997 B2 | 5/2011 | Rivas et al. |
| 7,992,627 B2 | 8/2011 | Bezama et al. |
| 8,059,405 B2 | 11/2011 | Campbell et al. |
| 8,074,706 B2 | 12/2011 | Su et al. |
| 8,077,460 B1 | 12/2011 | Dede et al. |
| 8,081,461 B2 | 12/2011 | Campbell et al. |
| 8,118,084 B2 | 2/2012 | Harvey |
| 8,194,406 B2 | 6/2012 | Campbell et al. |
| 8,391,008 B2 | 3/2013 | Dede |
| 2007/0084587 A1 | 4/2007 | Huang et al. |
| 2007/0119565 A1 | 5/2007 | Brunschwiler et al. |
| 2009/0316360 A1* | 12/2009 | Campbell et al. ............ 361/699 |
| 2010/0044018 A1 | 2/2010 | Furberg et al. |
| 2010/0097760 A1 | 4/2010 | Azar et al. |
| 2011/0146955 A1 | 6/2011 | Chen |
| 2011/0272120 A1 | 11/2011 | Joshi et al. |
| 2012/0097368 A1 | 4/2012 | Chen et al. |
| 2012/0168145 A1 | 7/2012 | Peterson et al. |
| 2012/0170222 A1 | 7/2012 | Dede et al. |
| 2012/0181005 A1 | 7/2012 | Downing |
| 2012/0212907 A1 | 8/2012 | Dede |
| 2012/0279684 A1 | 11/2012 | Keisling et al. |
| 2013/0020059 A1 | 1/2013 | Park |

OTHER PUBLICATIONS

Garimella, S.V., West, D.A., Two-Phase Liquid Jet Impingement Cooling, Purdue University, Cooling Technologies Research Center.

Skuriat, Robert, Optimum Cooling Solutions for Power Electronics, Nottingham University, Jul. 4, 2008.

Wadsworth, D.C., Mudawar, I., Cooling of a Multichip Electronic Module by Means of Confined Two-Dimensional Jets of Dielectric Liquid, Journal of Heat Transfer, Nov. 1990, vol. 112.

Arslan, Selin, Micro-Evaporator Design and Investigation of Phase Change in Tailored Microchannels, Columbia University, 2011.

Amon, Cristina H., S. C. Yao, C.F. Wu, and C. C. Hsieh. "Microelectromechanical System-Based Evaporative Thermal Management of High Heat Flux Electronics." Journal of Heat Transfer, 2005:66-75.

Brignoni, L., Garimella, S., "Performance Characteristics of Confined Impinging Air Jets with Surface Enhancement," Advances in Electronic Packaging, vol. 26-2, 1999: 2009-2014.

Ei-Sheikh, H., Garimella, S., "Heat Transfer from Pin-Fin Heat Sinks under Multiple Impinging Jets," IEEE Transactions on Advanced Packaging, vol. 23-1, 2000: 113-120.

Lay, J. H., and V.K. Dhir. "Nucleate Boiling Heat Flux Enhancement on Macro/Micro-Structured Surfaces Cooled by an Impinging Jet." Journal of Enhanced Heat Transfer, 1995: 177-88.

Sung, M. K., Mudawar, I., "Single-phase and two-phase cooling using hybrid micro-channel/slot-jet module." Int. J. of Heat and Mass Transfer, 51, 2008: 3825-2839.

Z. Q. Chen et al., "An experimental study of two phase flow and boiling heat transfer in bi-dispersed porous channels," available at http://www.me.ust.hk/~mezhao/pdf/49.PDF.

Palm et al., "Enhancement of Boiling Heat transfer by Application of a Porous Layer," available at: http://www.energy.kth.se/index.asp?pnr=10&ID=125&lang=0.

Zhao, Zenghui, "Enhanced heat transfer with jet impingement on structured-porous surfaces," available at http://ieeexplore.ieee.org/xpl/login.jsp?tp=&arnumber=6231577&url=http%3A%2F%2Fieeexplore.ieee.org%2Fxpls%2FABS_all.jsp%3Farnumber%3D6231577.

J. P. Li, et al., Porous Ti6Al4V scaffold directly fabricating by rapid prototyping: Preparation and in vitro experiment; Science Direct; Biomaterials 27 (2006) 1223-1235.

U.S. Appl. No. 13/683,660, filed Nov. 21, 2012 entitled "Cooling Apparatuses Having Sloped Vapor Outlet Channels".

U.S. Appl. No. 13/734,615, filed Jan. 4, 2013 entitled "Modular Jet Impingement Cooling Apparatuses with Exchangeable Jet Plates".

* cited by examiner

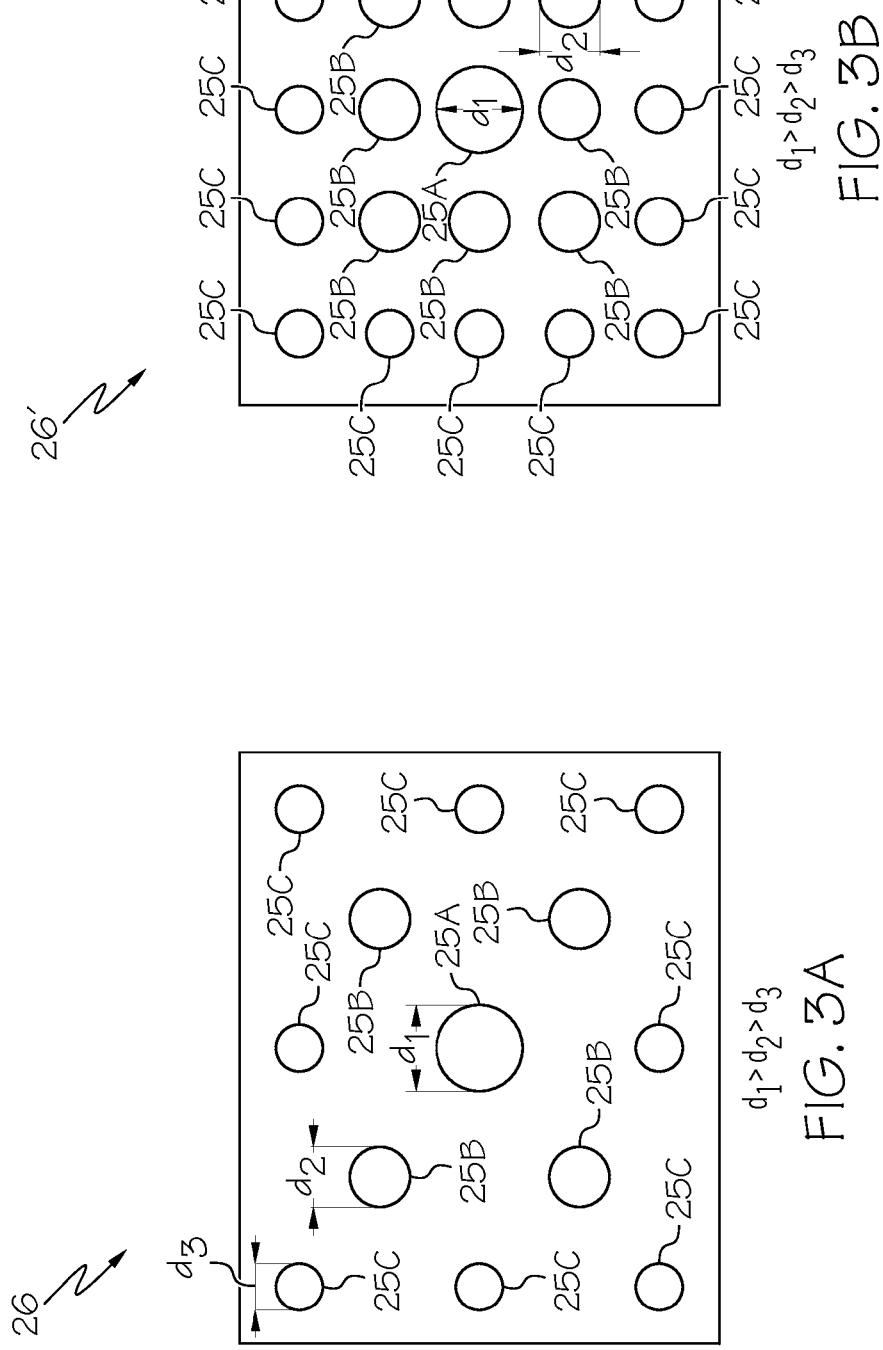

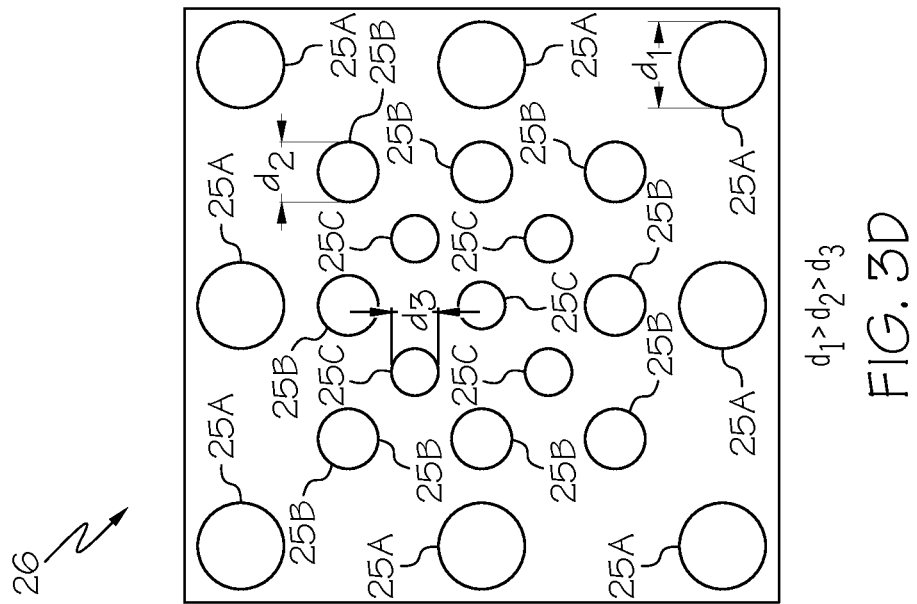
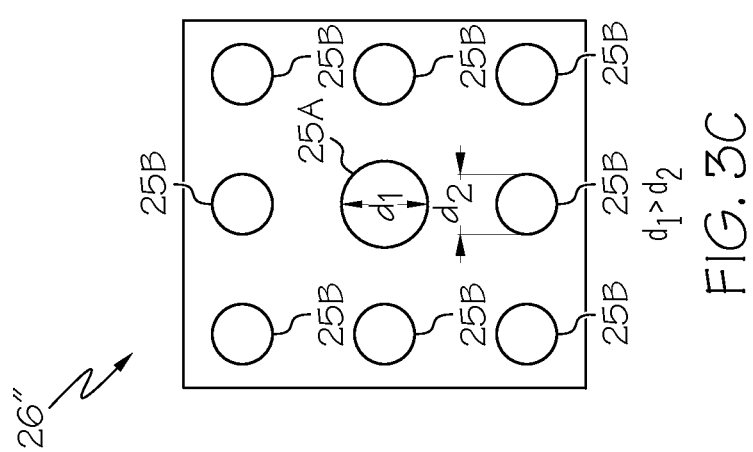

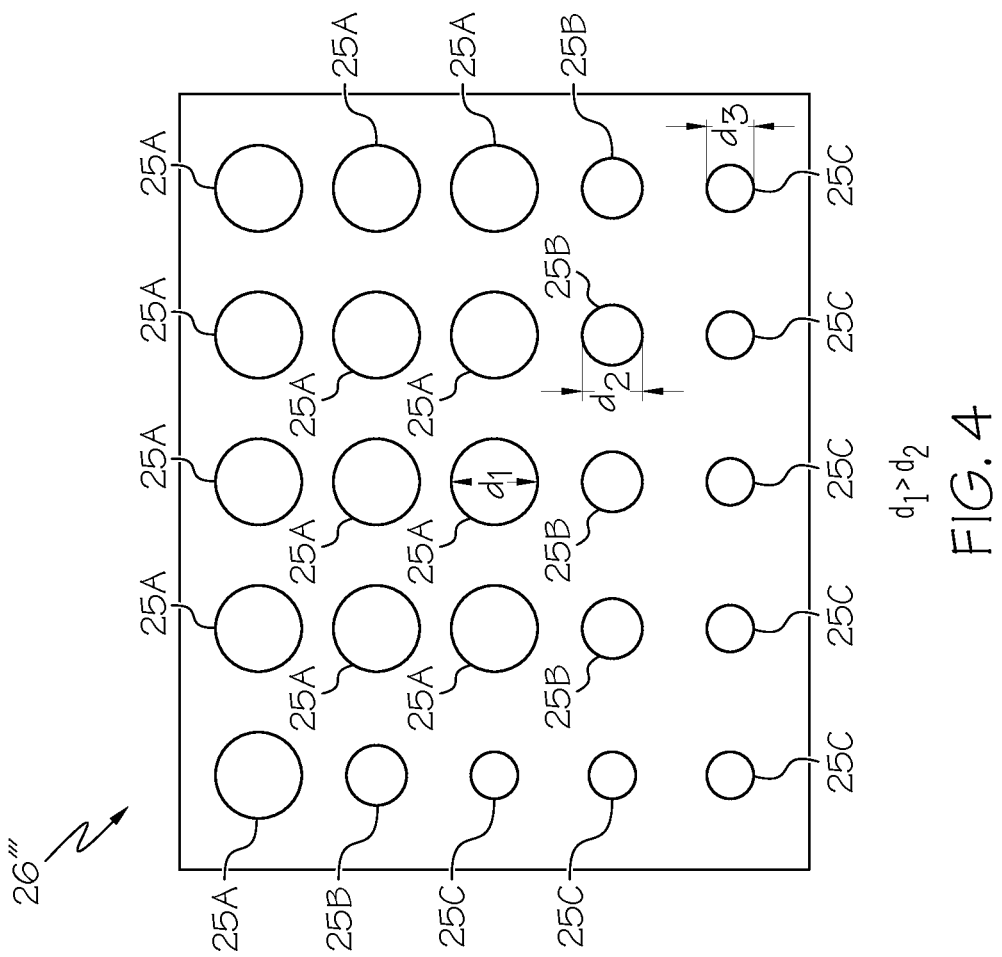

JET IMPINGEMENT COOLING APPARATUSES HAVING NON-UNIFORM JET ORIFICE SIZES

TECHNICAL FIELD

The present specification generally relates to cooling apparatuses for cooling heat generating devices and, more particularly, to jet impingement cooling apparatuses having non-uniform jet orifice sizes.

BACKGROUND

Heat generating devices, such as power semiconductor devices, may be coupled to a heat spreader to remove heat and lower the maximum operating temperature of the heat generating device. In some applications, cooling fluid may be used to receive heat generated by the heat generating device by convective thermal transfer, and remove such heat from the heat generating device. For example, jet impingement may be used to cool a heat generating device by directing impingement jets of coolant fluid onto the heat generating device or a target surface that is thermally coupled to the heat generating device. Additionally, jet impingement may also be combined with two-phase cooling, where the heat generating device is cooled by the phase change of the coolant fluid from a liquid to a vapor.

However, impingement jets that are positioned in close proximity to a fluid outlet may experience lower pressure within the impingement chamber, and be diverted toward the fluid outlet by a suction force and not impinge the target surface. The thermal properties of the cooling apparatus may be inhibited when the impingement jets do not impinge the target surface.

Accordingly, a need exists for alternative jet impingement cooling apparatuses wherein each impingement jet impinges a target surface.

SUMMARY

In one embodiment, a cooling apparatus includes at least one fluid inlet channel, at least one fluid outlet channel, a target surface, and a jet orifice surface that is offset from the target surface. The jet orifice surface includes an array of jet orifices fluidly coupled to the at least one fluid inlet channel, wherein each individual jet orifice of the array of jet orifices has an area corresponding to a distance of the individual jet orifice to the at least one fluid outlet channel such that individual jet orifices closer to the at least one fluid outlet have an area that is smaller than individual jet orifices further from the at least one fluid outlet.

In another embodiment, a cooling apparatus includes at least one fluid inlet channel, at least one fluid outlet channel, a target surface, and a jet orifice surface that is offset from the target surface. The jet orifice surface includes an array of jet orifices fluidly coupled to the at least one fluid inlet channel. The target surface and the jet orifice surface at least in part define an impingement chamber having at least one region of relatively high pressure and at least one region of relatively low pressure having a pressure that is lower than a pressure at the region of relatively high pressure when the coolant fluid flows through the array of jet orifices. Each individual jet orifice of the array of jet orifices has an area such that individual jet orifices proximate the at least one region of relatively low pressure have an area that is smaller than individual jet orifices proximate the at least one region of relatively high pressure.

In yet another embodiment, a cooling apparatus includes at least one fluid inlet channel, at least one fluid outlet channel, a target surface, and a jet orifice surface that is offset from the target surface. The jet orifice surface includes an array of jet orifices fluidly coupled to the at least one fluid inlet channel, wherein each individual jet orifice of the array of jet orifices has an area corresponding to a distance of the individual jet orifice to the at least one fluid outlet channel such that the area of the individual jet orifices decreases radially from a central region of the array of jet orifices. The cooling apparatus further includes an insulation assembly thermally coupled to the target surface.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 3A schematically depicts a jet orifice surface having an array of jet orifices according to one or more embodiments described and illustrated herein;

FIG. 3B schematically depicts a jet orifice surface having a 5×5 array of jet orifices according to one or more embodiments described and illustrated herein;

FIG. 3C schematically depicts a jet orifice surface having a 3×3 array of jet orifices according to one or more embodiments described and illustrated herein;

FIG. 3D schematically depicts a jet orifice surface having an array of jet orifices wherein the diameter of the array of jet orifices radially increases from a center according to one or more embodiments described and illustrated herein;

FIG. 4 schematically depicts a jet orifice surface having an array of jet orifices including asymmetrically sized jet orifices to compensate for the pressure variations depicted in FIG. 2 according to one or more embodiments described and illustrated herein;

DETAILED DESCRIPTION

Embodiments of the present disclosure are directed to jet impingement cooling apparatuses that may be utilized to cool heat generating devices, such as semiconductor devices. In the embodiments described herein, jet impingement is provided by directing jets of coolant fluid at an impingement region of a target surface, which may be a heat generating device or a thermally conductive target plate coupled to the heat generating device. Heat is transferred to the coolant fluid as it impinges the target surface. In addition to jet impingement, some embodiments may provide two-phase cooling, wherein the coolant fluid changes phase from a fluid to a vapor, thereby further removing heat flux from the heat generating device. Accordingly, some embodiments are directed to submerged two-phase, jet impingement cooling devices. Embodiments described herein may provide for impingement jets having substantially equal fluid velocity at the target surface despite variations in pressure within the cooling apparatus. As described in more detail below, regions near the fluid outlet(s) of the cooling apparatus may have lower pressure, and impingement jets located proximate to the fluid outlet(s) may lose velocity near the target surface and therefore not impinge the target surface, or non-orthogonally impinge the target surface. It is noted that pressure variation within the cooling apparatus may also be caused by non-uniform boiling of coolant fluid therein. Embodiments described herein have jet orifices with varying sizes (i.e., areas) such that each impingement jet impinges the target surface at substantially the same fluid velocity. For example, jet orifices closer to the fluid outlet(s) may have an area (e.g., a circular hole having a diameter) that is smaller that is an area of jet orifices further from the fluid outlet(s).

Optionally, embodiments may also guide vapor that is formed at the heat source (e.g., at the semiconductor device) due to the boiling of the coolant fluid away from the heat source to prevent the build-up of pressure within the cooling apparatus. More particularly, pitched vapor outlet channels may optionally be oriented to take advantage of the buoyancy of vapor bubbles to guide them away from the heat source. Accordingly, the pitched (i.e., sloped) vapor outlet channels resolve the inherent pressure build-up associated with the incomplete evacuation of vapor from the cooling apparatus which causes an increase in the saturation temperature of the coolant fluid and diminishes the effectiveness of heat transfer. Various embodiments of cooling apparatuses having jet orifices of varying size to provide for uniform fluid velocity at the target surface are described in detail below.

Figure 1:
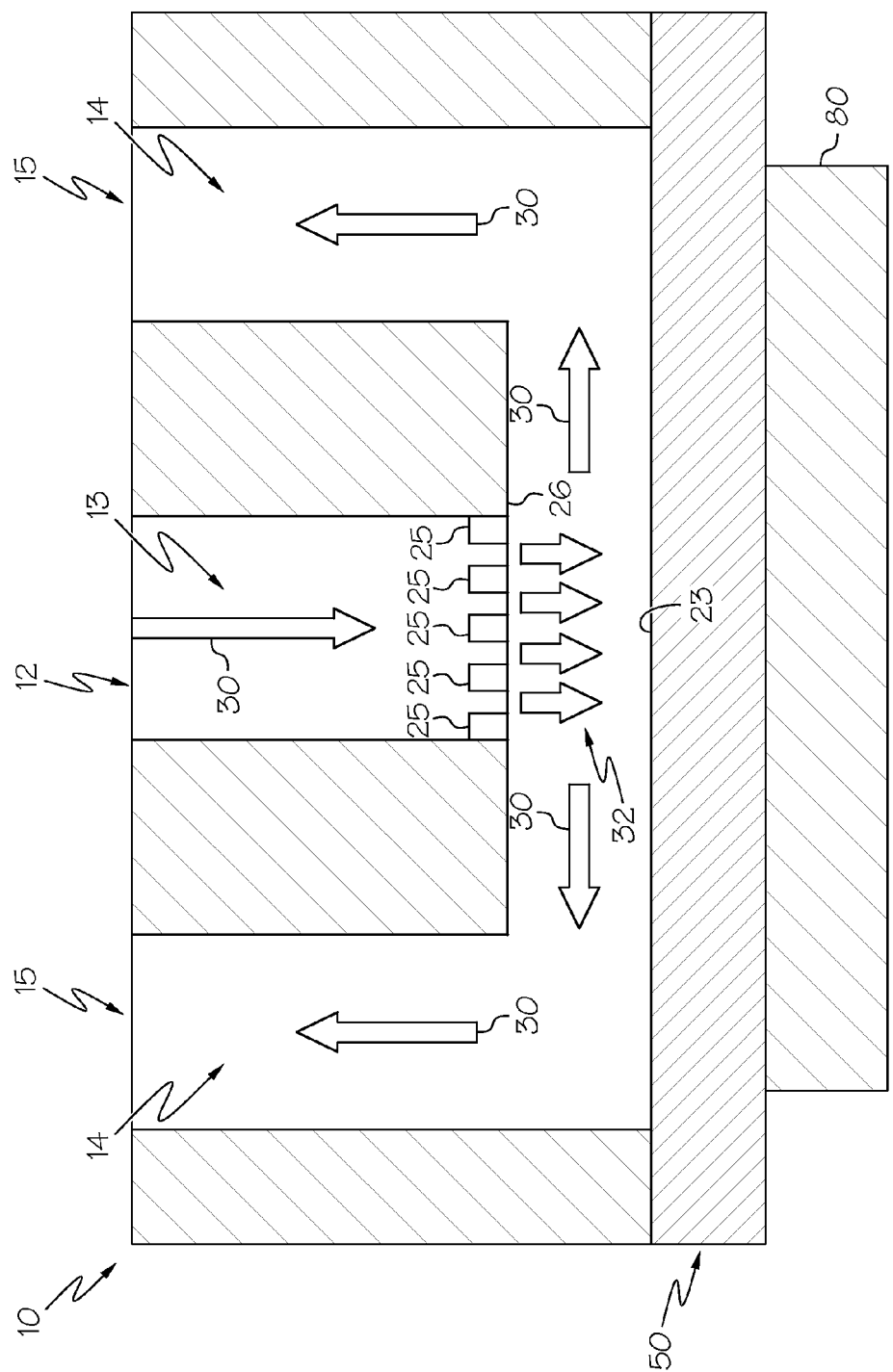
FIG. 1 schematically depicts a cross sectional view of a jet impingement, two-phase cooling apparatus according to one or more embodiments described and illustrated herein.

Referring now to FIG. 1, an example jet impingement cooling apparatus 10 is schematically depicted in cross section. The cooling apparatus 10 generally comprises a fluid inlet 12 that is fluidly coupled to a fluid inlet channel 13, and several fluid outlet channels 14 that are fluidly coupled to one or more fluid outlets 15. In some embodiments, the fluid outlet channels 14 may converge to a single fluid outlet 15, and/or exit one or more sides of the cooling apparatus 10 rather than the top as depicted in FIG. 1. The fluid inlet 12 and the fluid outlets 15 may be fluidly coupled to fluid lines (not shown) that are fluidly coupled to a coolant fluid reservoir (not shown). The coolant fluid may be any appropriate liquid, such as deionized water or radiator fluid, for example. The fluid inlet 12 and the fluid outlets 15 may be configured as couplings, such as male or female fluid couplings, for connecting fluid lines to the fluid inlet 12 and the fluid outlets 15. The fluid inlet channel 13 terminates at a jet orifice surface 26 having an array of jet orifices 25. Coolant fluid 30 flows through the fluid inlet channel 13 and the array of jet orifices 25. The coolant fluid 30 exits the jet orifices 25 as impingement jets 32 that impinge a thermally conductive target plate acting as a target surface 50 that is thermally coupled to a heat generating device, such as a semiconductor device 80. The impingement jets 32 may be substantially normal with respect to the target surface 50 in embodiments. Semiconductor devices 80 may include, but are not limited to, insulated gate bipolar transistors (IGBT), metal-oxide-semiconductor field effect transistors (MOSFET), power diodes, power bipolar transistors, and power thyristor devices. As an example and not a limitation, the semiconductor device 80 may be included in a power electronic module as a component in an inverter and/or converter circuit used to electrically power high load devices, such as electric motors in electrified vehicles (e.g., hybrid vehicles, plug in hybrid electric vehicles, plug in electric vehicles, and the like). In alternative embodiments, the impingement jets 32 directly impinge the heat generating device rather than an intermediate target surface 50. As described in more detail below, the target surface 50 may further include surface features, such as thermally conductive fins, posts, and the like, to further enable heat transfer from the heat generating device to the coolant fluid.

After impinging the target surface 50, which may be configured as a plate of thermally conductive material such as copper or aluminum, for example, the coolant fluid 30 flows away from an impingement region 23 within an impingement chamber 24 defined by the target surface 50 and the jet orifice surface 26. Some of the coolant fluid 30 may change phases from a liquid to a vapor due to the high temperature heat generating device being cooled. This phase change will cause vapor bubbles to form near the impingement region 23 and the heat generating device.

Figure 2:
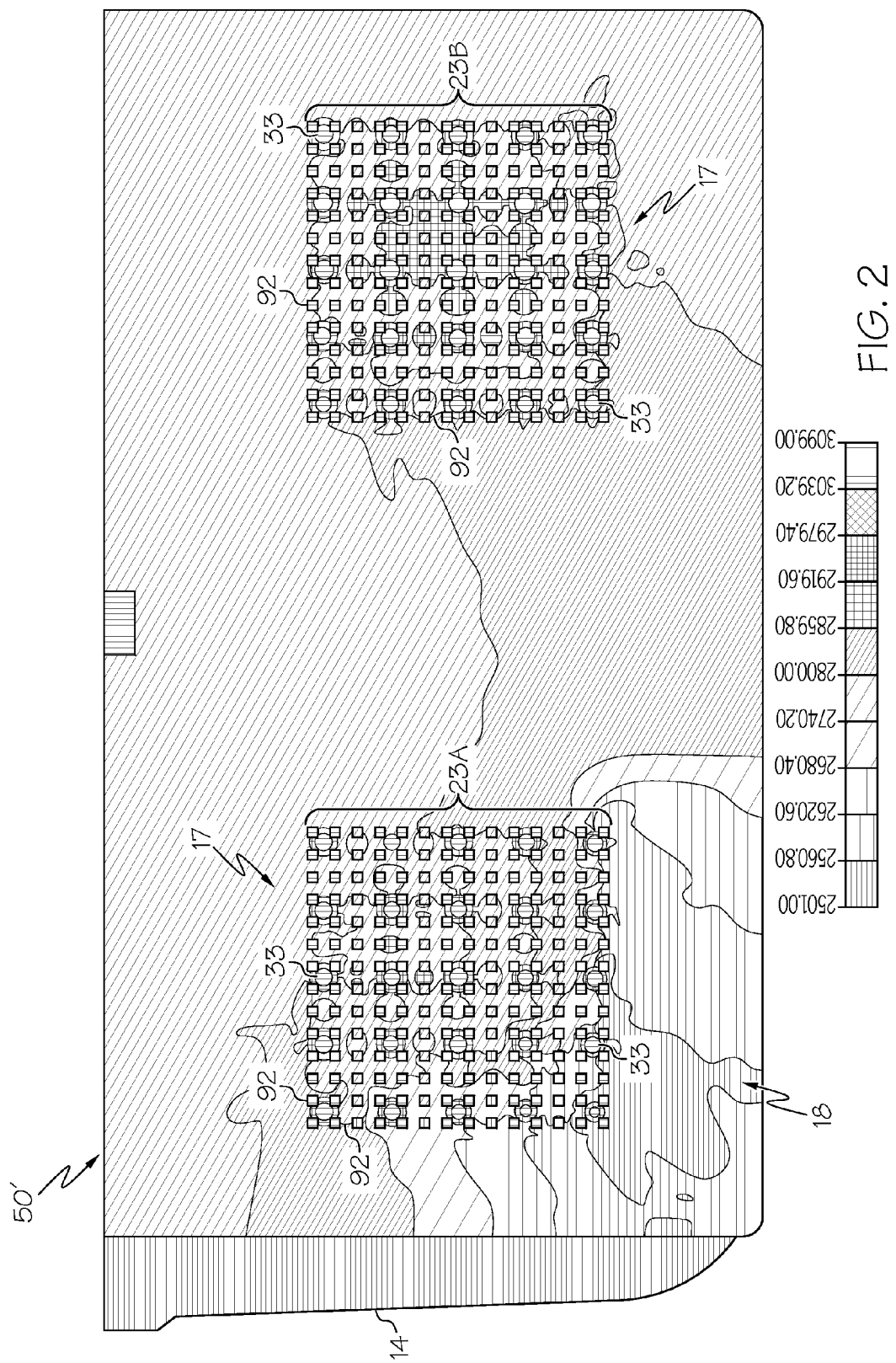
FIG. 2 graphically depicts simulated pressure contours at a target surface impinged with two impingement jet arrays and the effect of a fluid outlet.

Pressure within the impingement chamber 24 may vary. For example, regions of low pressure may be present within the impingement chamber 24 at locations close to one or more fluid outlet channels 14 or fluid outlets 15, while regions of high pressure may be present within the impingement chamber 24 at locations further away from the one or more fluid outlet channels 14 or fluid outlets 15. Pressure variation may also be caused by non-uniform boiling of the coolant fluid within the impingement chamber 24. Referring now to FIG. 2, simulated pressure contours at a target surface 50' resulting from two adjacent arrays of impingement jets are graphically depicted. It should be understood that FIG. 2 is provided for illustrative purposes only, and not intended to limit the embodiments described herein. The adjacent arrays of impingement jets impinge the target surface 50' at first and second impingement regions 23A, 23B. In the simulation, impingement locations 33 of individual impingement jets are positioned between surface enhancement features configured as posts 92 extending about 1.0 mm from the surface of the target surface 50'. As described in more detail below, surface features, such as the posts 92 shown in FIG. 2, may be provided to enhance thermal transfer as well as guide coolant fluid flow on the target surface 50'. In embodiments, the target surface 50 may be substantially flat with no surface enhancement features.

The impingement locations 33 have the highest pressure on the simulated target surface 50'. A region of relatively high pressure 17 surrounds the first and second impingement regions 23A, 23B and is present throughout a majority of the impingement chamber 24. A fluid outlet channel 14 is located proximate a bottom, left corner of the first impingement region 23A such that coolant fluid, after impinging the target surface 50' flows toward and out of the fluid outlet channel 14. However, the presence of the fluid outlet channel 14 produces a region of relatively low pressure 18 (i.e., lower pressure than the region of relatively high pressure) near the bottom, left corner of the first impingement region 23A that causes a suction effect that pulls the impingement jets of the array of impingement jets toward the fluid outlet channel 14. The suction effect may slow down and prevent the impingement jets that are closest to the fluid outlet channel 14 from impinging the target surface 50', which may adversely affect the thermal performance of the cooling apparatus. As shown in FIG. 2, the pressure at the impingement locations 33 at the bottom, left corner of the first impingement region 11A is lower and less pronounced than other impingement locations 33 further away from the region of relatively low pressure 18. This indicates that either some of the impingement jets do not impinge the target surface 50', or impinge the target surface 50' with a reduced fluid velocity and/or at a non-orthogonal angle as compared with impingement jets located further away from the region of relatively low pressure 18 (e.g., near the region of relatively high pressure).

The non-impingement of impingement jets reduces the thermal performance of the cooling apparatus 10. For example, non-impingement of neighboring impingement jets may cause cross-flow, which may prevent flow of coolant fluid across the target surface 50'. Further, if the impingement jet does not impinge upon the target surface 50', then the critical heat flux or maximum heat flux reached at the stagnation point will be lower than the impingement jet that has a higher velocity at the stagnation point.

Embodiments of the present disclosure ensure that each impingement jet of the array of impingement jets strike the target surface at a desired velocity by using jet orifices that are non-uniform in size (i.e., area) while still providing the same flow rate as an array of jet orifices having uniform size. Generally, the fluid velocity of an impingement jet may be increased by decreasing the size of the respective jet orifice. By increasing the fluid velocity of impingement jets close to a fluid outlet channel, such impingement jets may strike the target surface. Accordingly, jet orifices closer to a fluid outlet channel (or fluid outlet) may be smaller in size than jet orifices further away from a fluid outlet channel. Jet orifice spacing and size may be selected based on the size of the heated area to be cooled and the location of the fluid out channel(s).

FIGS. 3A-3C schematically depict three exemplary jet orifice surfaces 26, 26', 26", each having an array of jet orifices (individually as numbered 25A, 25B, 25C depending on the size). Although the jet orifices are depicted as circular in FIGS. 3A-3C, embodiments are not limited thereto. For example, the jet orifices may take on other shapes, such as cross-shaped, lobed, helical, and the like. In each of the illustrated jet orifice surfaces 26, 26', 26", the size (i.e., area) of the jet orifices 25B, 25C decreases radially from a large, central jet orifice 25A that is located at a central region of the array of jet orifices. Accordingly, the jet orifice surfaces 26, 26', 26" depicted in FIGS. 3A-3C may be suited for a cooling apparatus having four fluid outlet channels (or a continuous fluid outlet channel) about a perimeter of the impingement chamber 24 (see FIGS. 6-12 for an exemplary embodiment). Because the central orifice 25A is furthest from the fluid outlets, it is the largest orifice. In the embodiments illustrated in FIGS. 3A-3C, the jet orifices 25A, 25B, 25C are evenly spaced in an array.

Referring specifically to FIG. 3A, a jet orifice surface 26 includes an array of jet orifices 25A, 25B, 25C of different sizes. The jet orifice surface 26 may define an impingement chamber (e.g., impingement chamber 24 depicted in FIG. 1) having four fluid outlet channels 14 (either discrete fluid outlet channels or a single, continuous fluid outlet channel). Accordingly, the jet orifices 25C close to the perimeter of the jet orifice surface 26 are closer to a fluid outlet channel 14, and therefore in a region of relatively low pressure within the impingement chamber 24. Impingement jets exiting these jet orifices, if uniformly sized, may not successfully impinge the target surface 50. However, the jet orifices 25A, 25B, 25C depicted in FIG. 3A are non-uniformly sized such that the array of impingement jets orthogonally impinge the target surface 50. Central jet orifice 25A has a diameter $d_1$ that is greater than the diameter $d_2$ of jet orifices 25B, and the diameter $d_2$ is greater than a diameter $d_3$ of the smallest, outermost jet orifices 25C. In the arrangement of jet orifices depicted in FIG. 3A, secondary jet orifices 25B form a ring around central jet orifice 25A, while the smallest, outermost jet orifices 25C (tertiary jet orifices) form a second ring around jet orifices 25B.

The jet orifices 25A, 25B, 25C may be sized such that each impingement jet impinges the target surface 50. The smaller, outermost jet orifices 25C produce impingement jets that have a higher velocity upon exiting the jet orifice surface 26 than the larger jet orifices 25A, 25B. The higher velocity may ensure that impingement jets closest to the fluid outlet channels 14 impinge the target surface 50 despite the suction effect present in the regions of relatively low pressure at the perimeter of the cooling apparatus 10. In some embodiments, the jet orifices 25A, 25B, 25C are sized such that each impingement jet impinges the target surface 50 at substantially the same velocity. In other embodiments, the jet orifices 25A, 25B, 25C may be sized such that the velocity of the individual impingement jets are not substantially the same but different according to a desired impingement velocity pattern. For example, the jet orifices may be designed such that the outermost impingement jets impinge the target surface at a greater (or lesser) velocity than the inner impingement jets. The velocity and impingement velocity pattern may vary depending on the application. Accordingly, the smaller, outermost jet orifices 25C may mitigate the effects seen by a jet orifice surface having uniform jet orifice sizes as described above, thereby improving thermal performance.

In some embodiments, the smaller, outermost jet orifices 25C may be sized to produce impingement jets that have a fluid velocity that is double that of the fluid velocity of the impingement jet of the central jet orifice 25A upon exiting the jet orifice surface 26. However, it should be understood that embodiments may have a velocity ratio different than two times between the fluid velocity of the impingement jets exiting the outermost jet orifices 25C and the impingement jet(s) exiting the central jet orifice 25A. As an example and not a limitation, the central jet orifice 25A may have a diameter of about 1.35 mm, the secondary jet orifices 25B may have a diameter of about 0.9 mm, and the tertiary jet orifices 25C may have a diameter of about 0.6 mm. These diameters provide for about the same flow area as a uniform orifice design having jet orifices with a 0.75 mm diameter. It should be understood that other dimensions may be utilized, and these dimensions are used only as an example. The number, size, and spacing of the jet orifices may depend on many factors, such as the size of the heated area, the number of heated areas, the heat flux present at the heated area, and the distance from the jet orifice surface 26 to the target surface 50. As described above, the smaller sized jet orifices 25C may ensure that impingement jets close to the fluid outlets impinge the target surface 50.

Similarly, FIG. 3B schematically depicts a jet orifice surface 26' with a 5×5 array of jet orifices 25A, 25B, 25C having a diameter that radially decreases from a large, central jet orifice 25A ($d_1 > d_2 > d_3$). The secondary jet orifices 25B form a ring around the central jet orifice 25A, while the tertiary jet orifices 25C form a ring around the secondary jet orifices 25B. FIG. 3C schematically depicts a jet orifice surface 26" having a 3×3 array of jet orifices 25A, 25B. A central jet orifice 25A having a diameter $d_1$ is surrounded by eight secondary jet orifices 25B having a diameter $d_2$ that is less than diameter $d_1$, in the illustrated embodiment.

Embodiments are not limited to jet orifice surfaces having an array of jet orifices 25C, 25B, 25C wherein the diameter of the jet orifices radially decreases from a center. FIG. 3D depicts an embodiment wherein the jet orifices 25A-25D increase radially from a central region. The smallest jet orifices 25C having a diameter $d_3$ are located at a center of the array of jet orifices, while intermediate jet orifices 25B having a diameter $d_2$ surround the smallest primary jet orifices 25C, and large jet orifices 25A having a diameter $d_1$ surround the intermediate jet orifices ($d_1 > d_2 > d_3$). Accordingly, the diameter of the jet orifices 25A-25C increases radially from the center. Such an arrangement may be desirable in cooling apparatuses wherein the fluid outlet is centrally located with respect to the target surface 50.

It should be understood that other configurations are also possible. For example, in embodiments wherein there is only one fluid outlet channel, such as depicted in FIG. 2, the diameter of the jet orifices may not radially decrease. Referring now to FIG. 4, an exemplary jet orifice surface 26''' having an array of jet orifices 25A, 25B, 25C sized to ensure that the impingement jets impinge the target surface 50' with the placement of the fluid outlet channel 14 depicted in FIG. 2 is schematically illustrated. The size of the jet orifices 25A, 25B, 25C decrease asymmetrically from the upper, right corner of the jet orifice surface 26'''. The small jet orifices 25C having a diameter $d_3$ are disposed proximate the region of relatively low pressure 18 and closest to the fluid outlet channel 14 depicted in FIG. 2. Secondary jet orifices 25B having a diameter $d_2$ are adjacent to the small jet orifices 25C, while large jet orifices 25A having a diameter $d_1$ are adjacent to the secondary jet orifices 25B and furthest from the fluid outlet channel 14 (wherein $d_1 > d_2 > d_3$). Diameter $d_3$ may be such that the impingement jets produced by the small jet orifices 25C impinge the target surface despite being within the region of relatively low pressure 18 depicted in FIG. 2. It should be understood that embodiments are not limited to the configuration depicted in FIG. 4, and that other configurations are possible. For example, the jet orifice surface 26''' depicted in FIG. 4 may have jet orifices of only two sizes (e.g., small jet orifices 25C and large jet orifices 25A).

Figure 5:
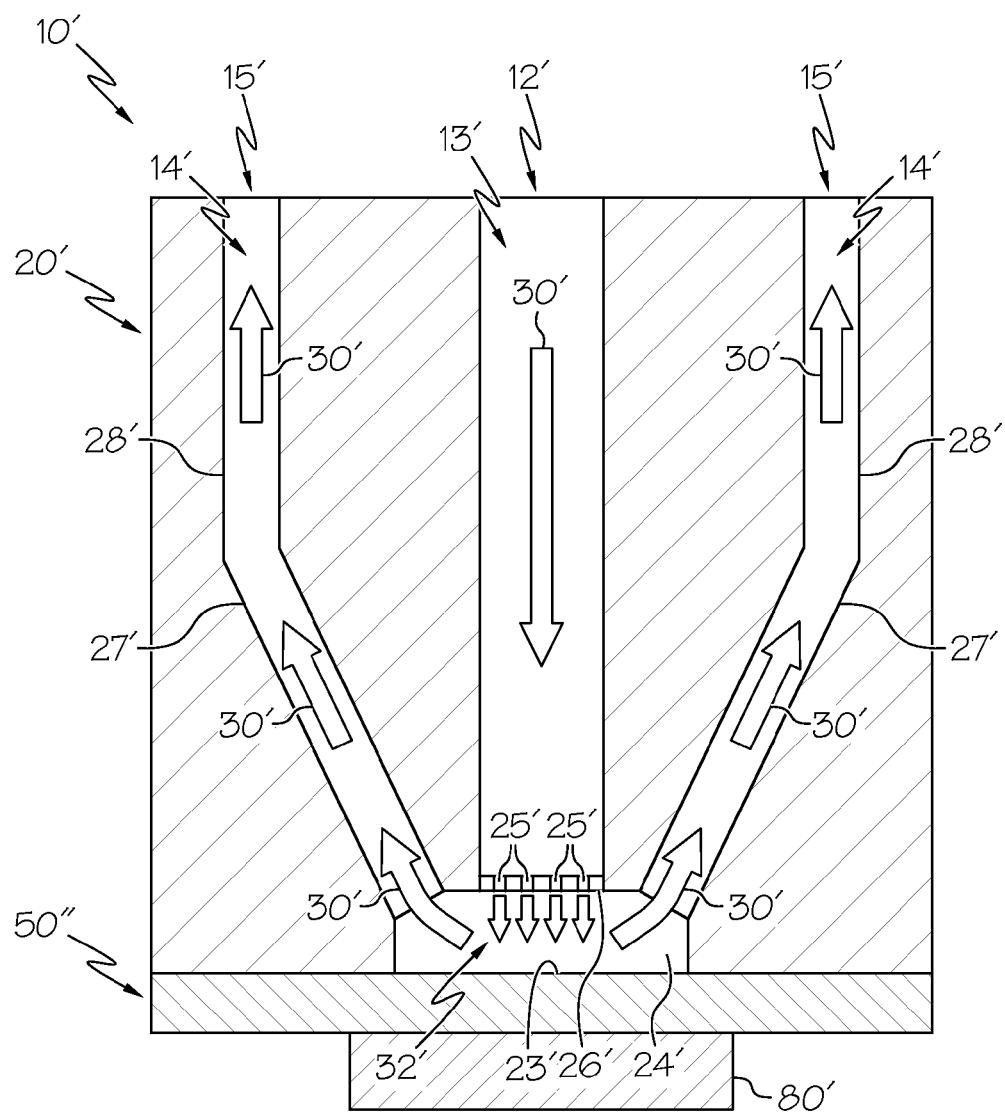
FIG. 5 schematically depicts a cross sectional view of a cooling apparatus having sloped vapor outlet channels according to one or more embodiments described and illustrated herein.

The jet orifice surfaces having non-uniform jet orifice sizes described above may be implemented into any jet impingement cooling apparatus. Referring now to FIG. 5, an example cooling apparatus 10' having sloped vapor channels is schematically depicted in cross section. As described in more detail below, the sloped vapor channels may aid in efficiently removing the vapor bubbles from cooling apparatus 10'. The cooling apparatus 10' generally comprises a fluid inlet 12' that is fluidly coupled to a fluid inlet channel 13', and several fluid outlet channels 14' that are fluidly coupled to one or more fluid outlets 15'. In some embodiments, the fluid outlet channels 14 may converge to a single fluid outlet. The fluid inlet 12' and the fluid outlets 15' may be fluidly coupled to fluid lines (not shown) that are fluidly coupled to a coolant fluid reservoir (not shown). As described above with reference to FIG. 1, the fluid inlet 12' and the fluid outlets 15' may be configured as couplings, such as male or female fluid couplings, for connecting fluid lines to the fluid inlet 12' and the fluid outlets 15'. The fluid inlet channel 13' terminates at a jet orifice surface 26' having an array of jet orifices 25' with non-uniform sizes as described above. Coolant fluid 30' flows through the fluid inlet channel 13' and the jet orifices 25'. The coolant fluid 30' exits the jet orifices 25' as impingement jets 32' that impinge a thermally conductive target surface 50'' that is thermally coupled to a heat generating device, such as a semiconductor device 80'.

After impinging the target surface 50'', the coolant fluid 30' flows away from an impingement region 23' within an impingement chamber 24' defined by the target surface 50'' and the jet orifice surface 26'. Some of the coolant fluid 30' changes phases from a liquid to a vapor due to the high temperature heat generating device being cooled. This phase change will cause vapor bubbles to form near the impingement region 23' and the heat generating device. Collection of vapor bubbles within the impingement chamber 24' causes the pressure within the cooling apparatus to increase, which further causes an increase in the saturation temperature of the coolant fluid that diminishes the effectiveness of heat transfer.

Body forces from the bulk fluid motion of the coolant fluid alone may not sufficiently remove all of the vapor formed within the impingement chamber 24'. Buoyant forces, arising from the lower density of the vapor relative to its surrounding liquid medium, can counteract the body force, thereby leading to the pooling of vapor at the top of the cooling chamber. Because vapor is a gas and is compressible, pressure gradually increases over time as vapor collects, causing an increase in the saturation temperature of the coolant fluid.

The example cooling apparatus 10' further includes several sloped vapor outlet channels 27' that are fluidly coupled to the impingement chamber 24'. The sloped vapor outlet channels 27' take advantage of the buoyancy of the vapor bubbles to guide them away from the impingement region 23'. Accordingly, the geometry of the sloped vapor outlet channels 27' accounts for, and utilizes, both body and buoyant forces to drive the vapor away from the impingement region 23' and the heat generating device. Thus, pressure and the saturation temperature of the coolant fluid 30' should remain constant regardless of heat input and vapor generation within the impingement chamber 24' of the cooling apparatus 10'. In the illustrated embodiment, the sloped vapor outlet channels 27' transition to vertical vapor outlet channels 28' through which the coolant flows and exits the cooling apparatus 10'.

Figure 6:
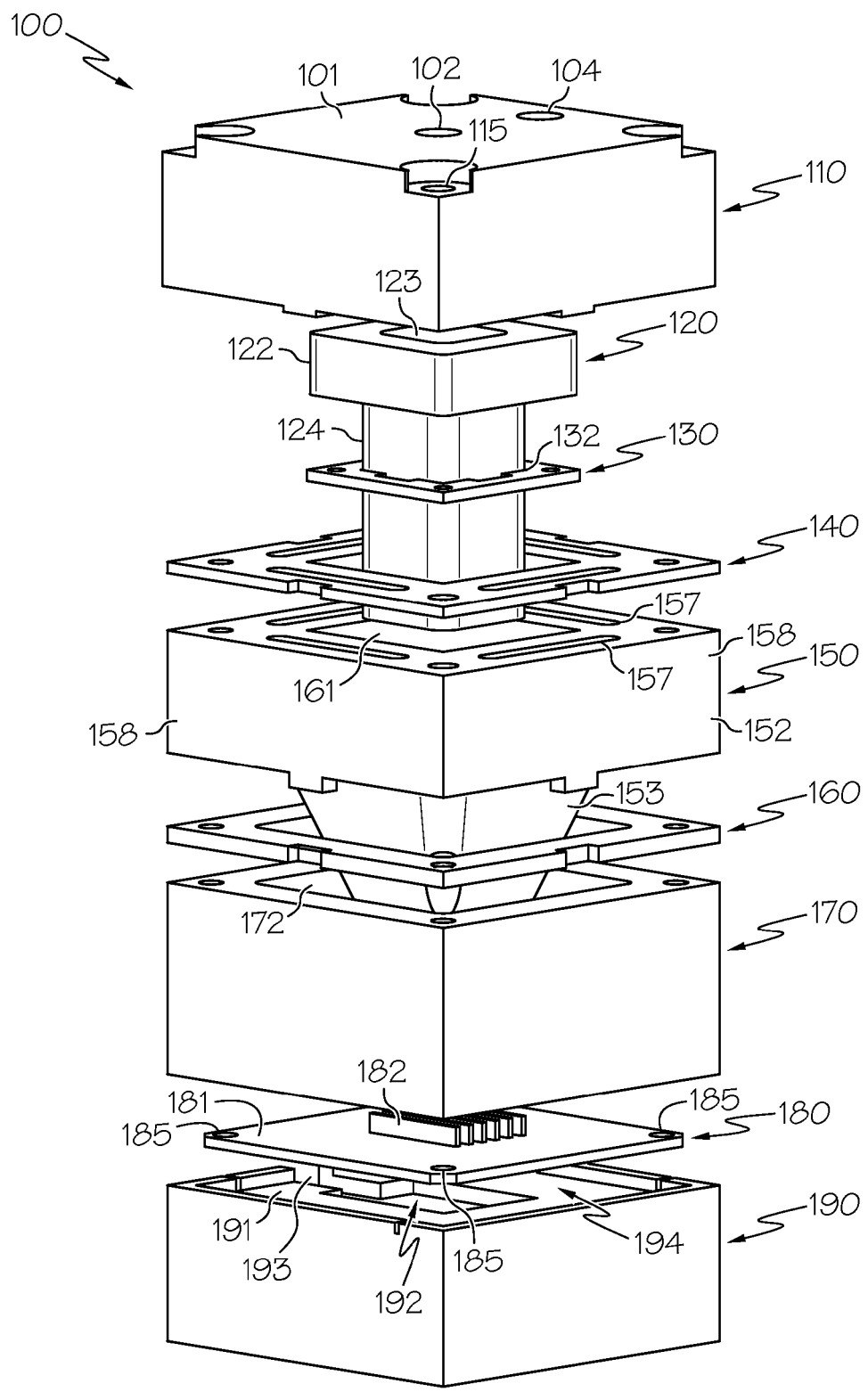
FIG. 6 schematically depicts an exploded view of a cooling apparatus according to one or more embodiments described and illustrated herein.

Referring now to FIG. 6, an example cooling apparatus 100 is depicted in an exploded view. It should be understood that the cooling apparatus 100 depicted in FIGS. 6-12 is provided for illustrative purposes only, and that the jet orifice surfaces with non-uniform orifice sizes may be implemented in cooling apparatuses other than that depicted in FIGS. 6-12. Generally, the cooling apparatus comprises an inlet-outlet manifold 110, a jet plate manifold 150 coupled to the inlet-outlet manifold 110, a jet orifice plate 120 disposed within the jet plate manifold 150, a vapor manifold 170 coupled to the jet plate manifold 150, and a target surface 180 disposed within an insulation assembly 190 that is coupled to the vapor manifold 170. Several gaskets may be provided between the various components to prevent fluid from escaping the cooling apparatus 100. For example, a jet plate gasket 130 may be positioned between a flange portion 122 of the jet orifice plate 120 and a seat 131 (see FIG. 11) of the jet plate manifold 150, a jet plate manifold gasket 140 may be positioned between the inlet-outlet manifold 110 and the jet plate manifold 150, and a vapor manifold gasket 160 may be positioned between the jet plate manifold 150 and the vapor manifold 170.

Figure 7:
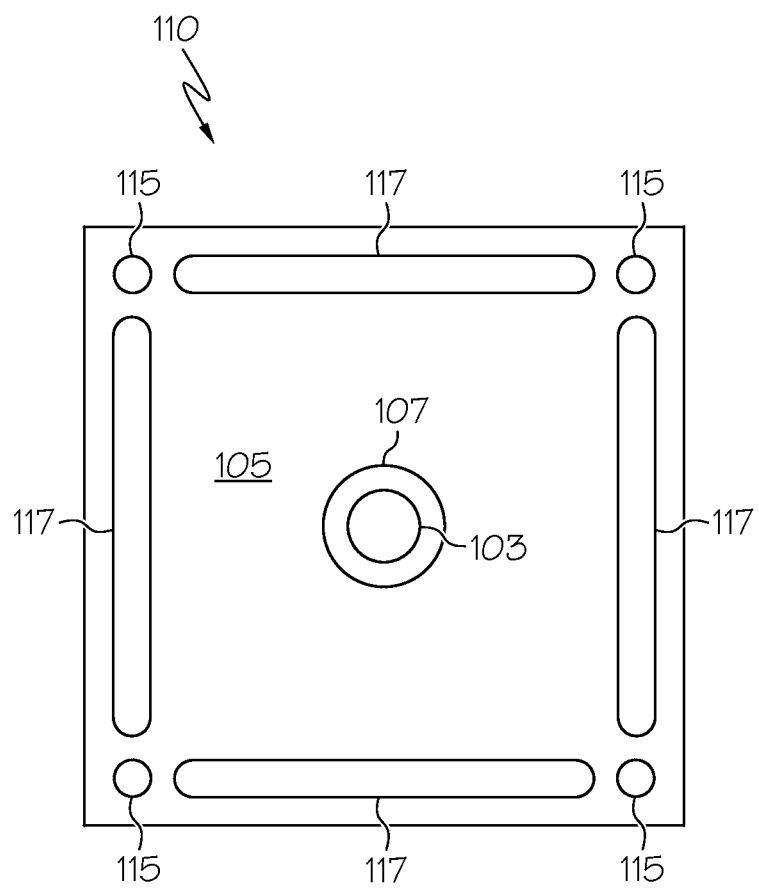
FIG. 7 schematically depicts a bottom view of the inlet-outlet manifold of the cooling apparatus depicted in FIG. 6 according to one or more embodiments described and illustrated herein.

FIG. 7 is a bottom view of the inlet-outlet manifold 110. Referring to FIGS. 6 and 7, the inlet-outlet manifold 110 comprises a fluid inlet 102 at a first surface 101 that is fluidly coupled to an inlet manifold channel 103 within a bulk of the inlet-outlet manifold 110. The inlet manifold channel 103 opens at a second surface 105 of the inlet-outlet manifold 110. In the illustrated body, the inlet manifold channel 103 widens to a larger opening 107 at the second surface 105. A fluid outlet 104 is also present on the first surface 101. The fluid inlet 102 and the fluid outlet 104 may be fluidly coupled to input and output fluid lines, respectively. Coolant fluid is provided to the cooling apparatus 100 through the fluid inlet 102, and is removed from the cooling apparatus 100 through the fluid outlet 104.

Referring to FIG. 7, the second surface 105 of the inlet-outlet manifold 110 also comprises four slot-shaped outlet openings 117 along a perimeter of the inlet-outlet manifold 110. Briefly referring to FIG. 11, each slot-shaped outlet opening 117 is fluidly coupled to an internal outlet manifold channel 114a-114d that is fluidly coupled to the fluid outlet. It is noted that outlet manifold channel 114d is not visible in FIG. 7. The outlet manifold channels 114a-114d are disposed around the inlet manifold channel 103. As described in more detail below, the outlet manifold channels 114a-114d slope upwardly toward the fluid outlet 104 near the first surface 101 of the inlet-outlet manifold 110. Referring once again to FIG. 7, the inlet-outlet manifold 110 further comprises a plurality of through-holes configured to receive a plurality of fasteners (e.g., screws) to maintain the various components of the cooling apparatus 100 in an assembled configuration. It should be understood that, in alternative embodiments, the various components may be coupled together by bonding layers (e.g., solder layers) rather than by mechanical fasteners.

Figure 8A:
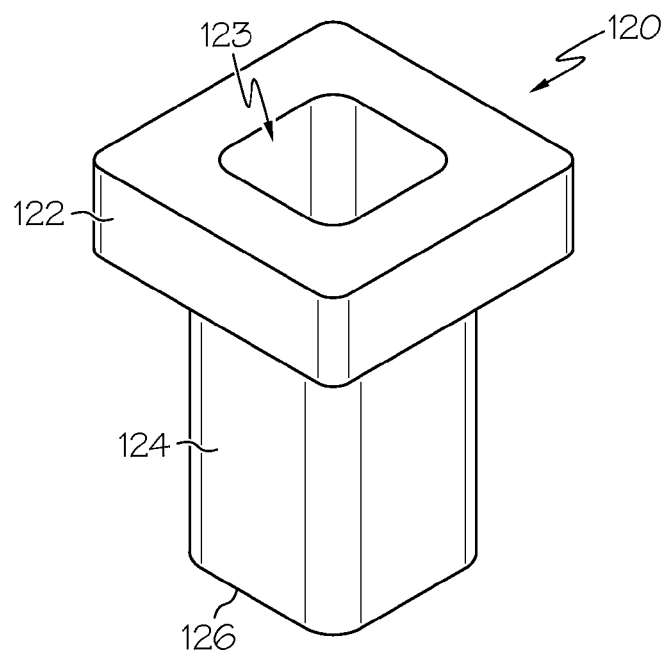
FIG. 8A schematically depicts a perspective view of a jet orifice plate of the cooling apparatus depicted in FIG. 6 according to one or more embodiments described and illustrated herein.
Figure 8B:
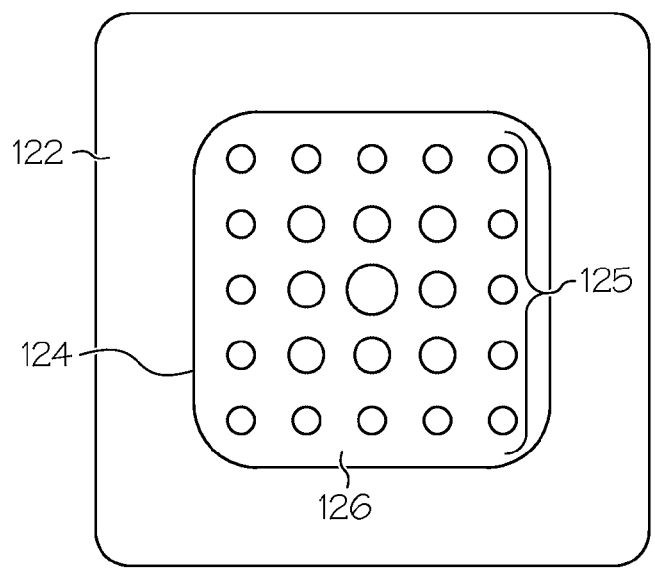
FIG. 8B schematically depicts a bottom view of the jet orifice plate depicted in FIG. 8A.

FIG. 8A schematically depicts a perspective view of an example jet orifice plate 120, while FIG. 8B schematically depicts a bottom view of the jet orifice plate 120 depicted in FIG. 8A. Generally, the illustrated jet orifice plate 120 comprises a flange portion 122, and a narrow portion 124 extending from the flange portion 122. A jet orifice surface 126 is provided on an underside surface of the narrow portion 124. A jet channel extends 123 through the flange portion 122 and the narrow portion 124, and is fluidly coupled to the inlet manifold to receive input coolant fluid. The jet orifice surface 126 comprises an array of jet orifices 125 through which coolant fluid flows as impingement jets, as described above. In the illustrated embodiment, the jet orifice surface has an array of jet orifices with non-uniform jet orifice sizes similar to that depicted in FIG. 3B. It should be understood that other jet orifice array configurations are also possible. The jet orifice plate 120 is configured to be disposed within the jet plate manifold 150. In some embodiments, the flange portion 122 further includes through-holes configured to receive fasteners that couple the jet orifice plate 120 to the jet plate manifold 150, or one or more through-holes serving as a pressure relief.

Figure 9A:
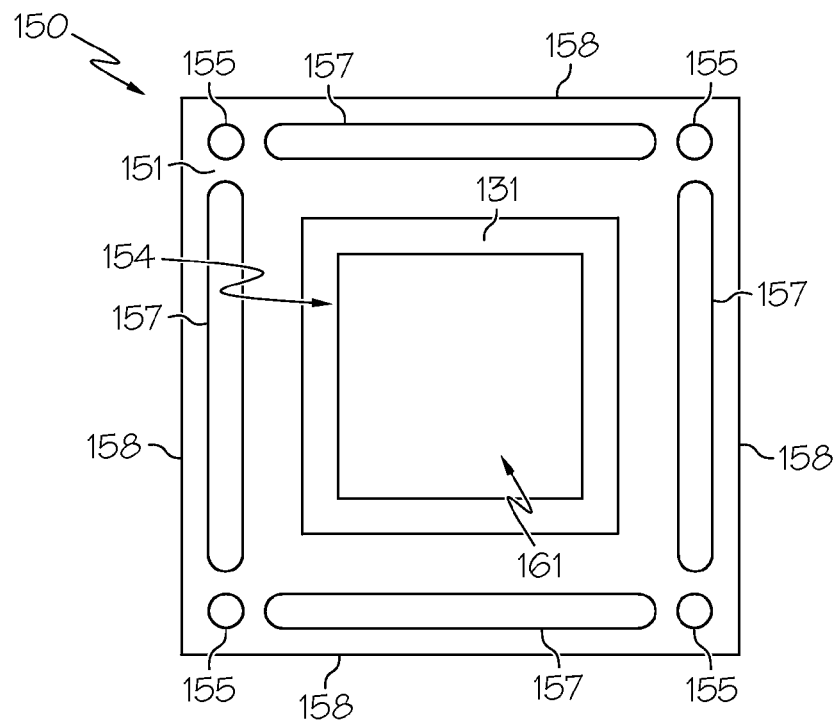
FIG. 9A schematically depicts a top view of the jet plate manifold of the cooling apparatus depicted in FIG. 6 according to one or more embodiments described and illustrated herein.
Figure 9B:
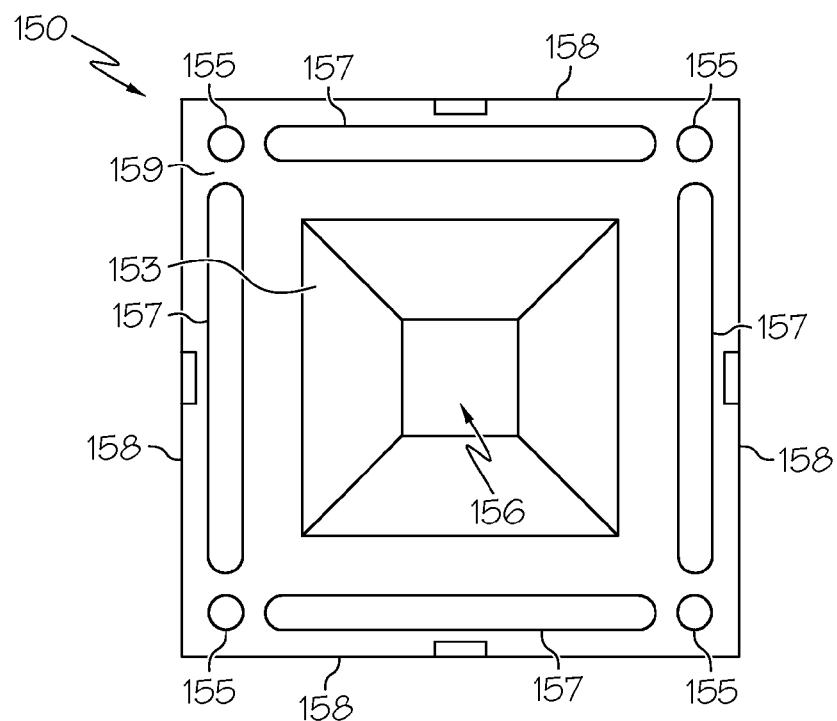
FIG. 9B schematically depicts a bottom view of the jet plate manifold depicted in FIG. 9A.
Figure 9C:
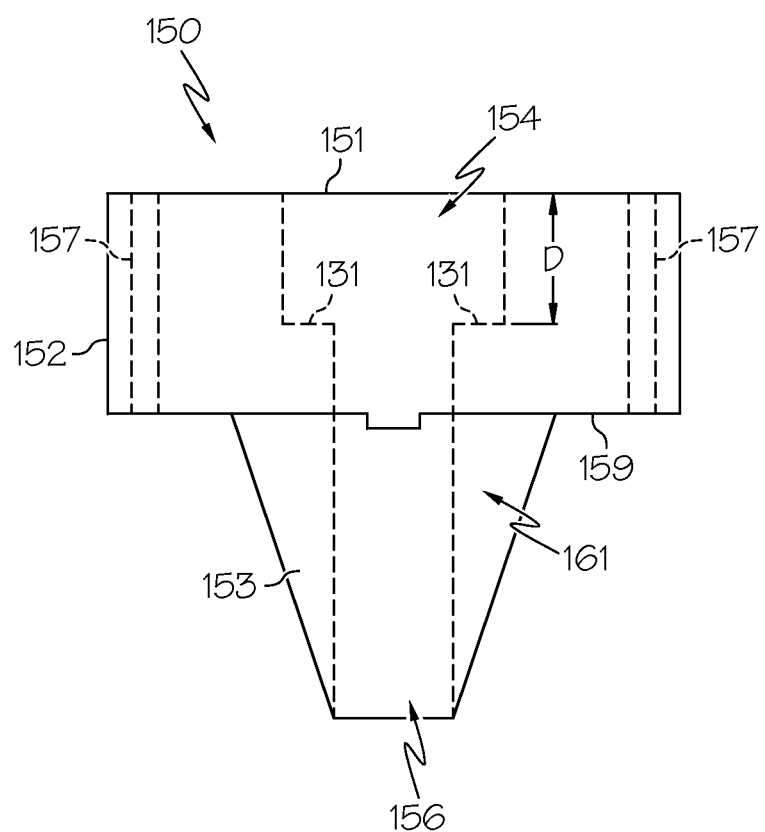
FIG. 9C schematically depicts a side view of the jet plate manifold depicted in FIG. 9A.
Figure 10A:
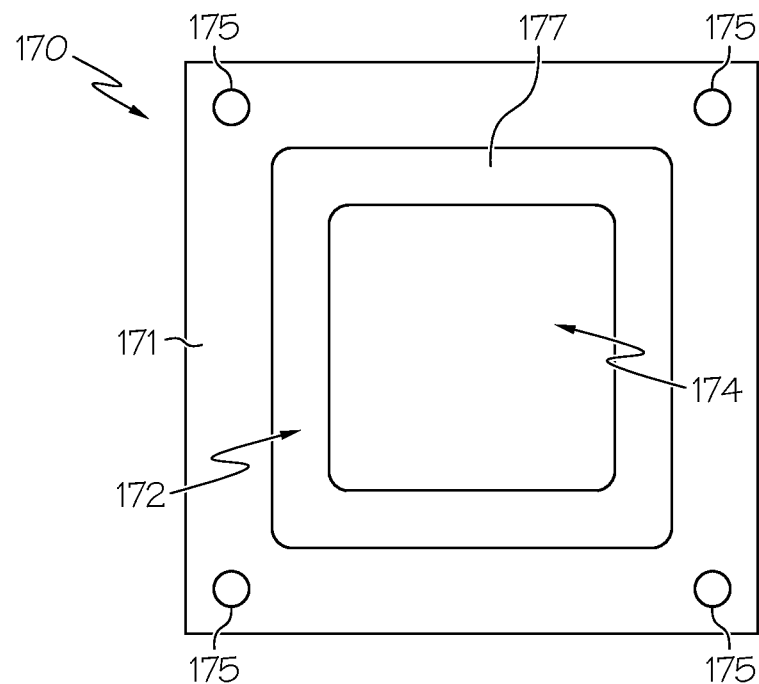
FIG. 10A depicts a top view of the vapor manifold of the cooling apparatus depicted in FIG. 6 according to one or more embodiments described and illustrated herein.
Figure 10B:
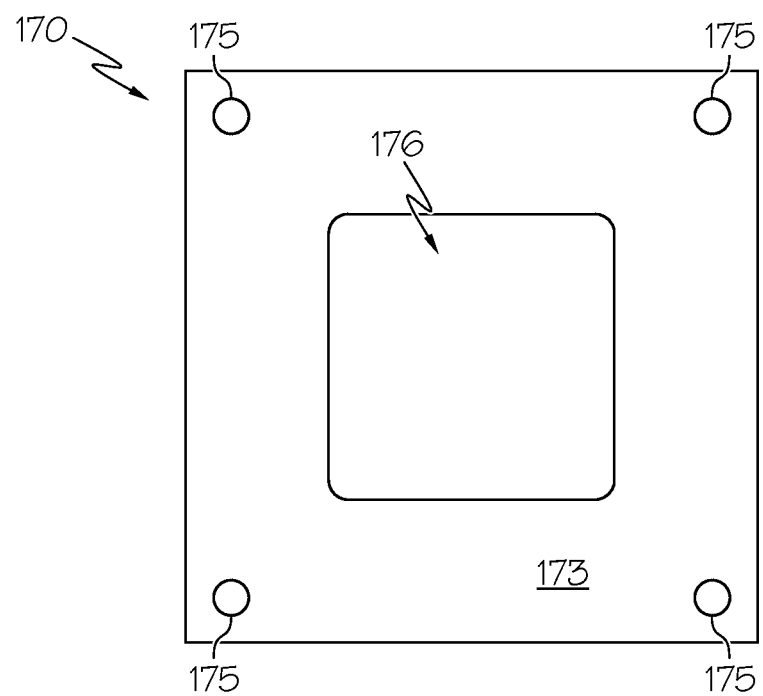
FIG. 10B schematically depicts a bottom view of the vapor manifold depicted in FIG. 10A.
Figure 10C:
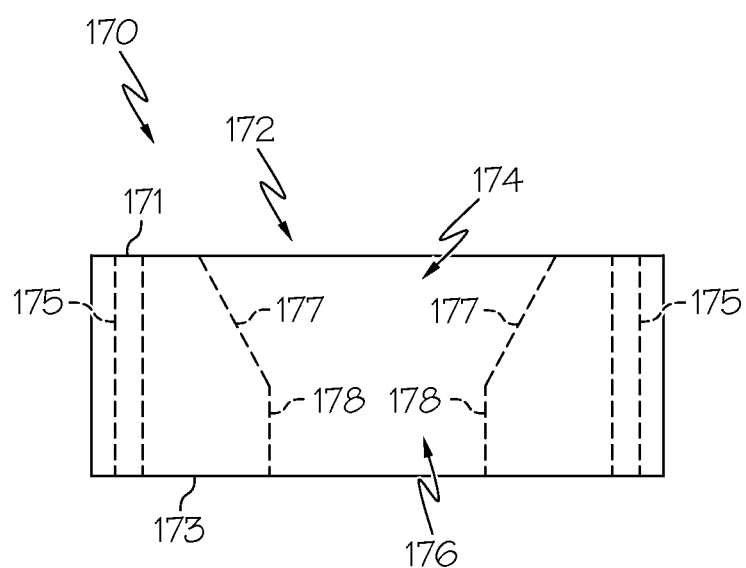
FIG. 10C schematically depicts a side view of the vapor manifold depicted in FIG. 10A.

FIG. 9A is a top view of the jet plate manifold 150 depicted in FIG. 6, while FIGS. 9B and 9C are bottom and side views of the jet plate manifold 150, respectively. Referring now to FIGS. 6 and 9A-9C, the jet plate manifold 150 generally comprises an upper portion 152 defined by four walls 158, and a tapered portion 153 extending from the upper portion 152. Four slot channels 157 are provided within the four walls 158 of the upper portion. The slot channels 157 extend from a first surface 151 to a second surface 159 of the jet plate manifold 150, and are positioned such that they are fluidly coupled to the slot-shaped outlet openings 117 and outlet manifold channels 114a-114d of the inlet-outlet manifold 110 when the jet plate manifold 150 is coupled to the inlet-outlet manifold 110. The jet plate manifold 150 may further comprise a plurality of through-holes 155 for receiving fasteners.

The first surface 151 (i.e., the upper surface) has a first opening 154 that extends to a depth D, and then narrows to a second opening 156, thereby defining a seat 131 (FIG. 9C). The exemplary tapered portion 153 comprises four walls that taper downwardly away from the upper portion 152. As described in more detail below, the tapered portion 153 defines sloped vapor outlet channels 176 (i.e., fluid outlet channels) through which coolant fluid flows.

Figure 11:
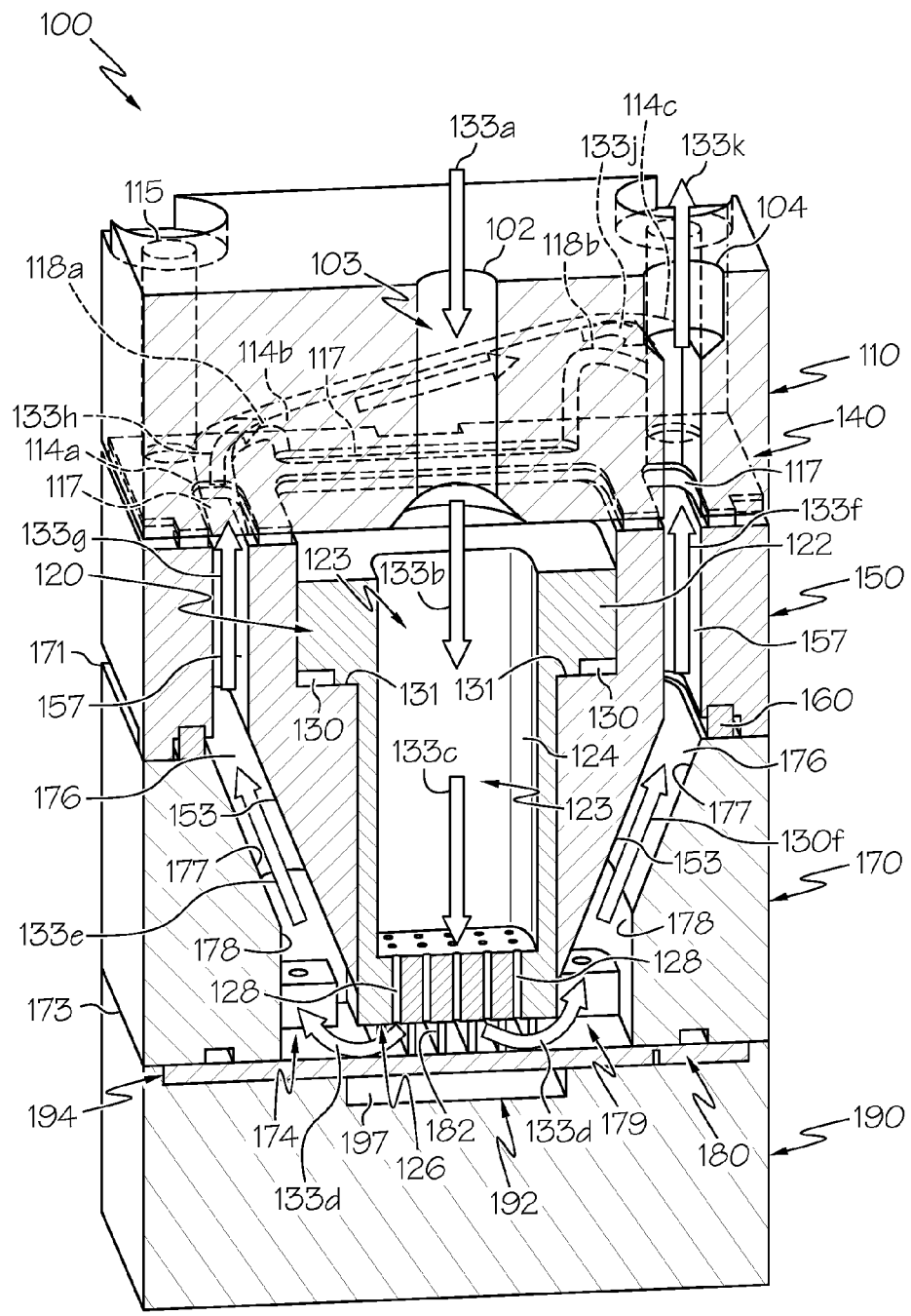
FIG. 11 schematically depicts a cross sectional, partially transparent perspective view of an assembled cooling apparatus according to one or more embodiments described and illustrated herein.

The first opening 154 and the second opening 156 define a jet plate manifold channel 161 extending from the first surface 151 to the second surface 159. The jet orifice plate 120 is disposed within the jet plate manifold channel 161 of the jet plate manifold 150. As shown in FIG. 11, which is a cross-sectional view of an exemplary cooling apparatus 100, the flange portion 122 of the jet orifice plate 120 is positioned on the seat 131 defined by the transition between the first opening 154 and the second opening 156. In some embodiments, a jet plate gasket 130 may be positioned between the flange portion 122 and the seat 131. The narrow portion 124 of the jet orifice plate 120 is disposed within the second opening 156 and may extend beyond the tapered portion 153, as depicted in FIG. 11.

Referring now to FIGS. 6, 10A-10C and 11, the vapor manifold 170 comprises tapered walls 177 that taper from a first surface 171 toward a second surface 173. The tapered walls 177 define a first opening at 174A at the first surface 171 of the vapor manifold 170. The tapered walls 177 terminate at straight walls 178 that extend to the second surface 173, thereby defining a second opening 174B. The first and second openings 174A, 174B define a vapor manifold opening 172 into which the tapered portion 153 of the jet plate manifold 150 and the narrow portion 124 of the jet orifice plate 120 are disposed. As described in more detail below and depicted in FIG. 11, the tapered walls 177 cooperate with the tapered portion 153 of the jet plate manifold 150 to define the sloped vapor outlet channels 176 that act as fluid outlet channels that surround the jet orifice surface 126. The exemplary vapor manifold 170 further comprises through-holes 175, which may be threaded to receive fasteners to couple various components of the cooling apparatus 100 together.

The vapor manifold 170 is coupled to a thermally conductive target surface 180 disposed within an insulation assembly 190, as shown in FIGS. 6 and 11. The target surface 180 also comprises through-holes 185 for receiving fasteners. The target surface 180 may be fabricated from a thermally conductive material, such as copper or aluminum, for example. In the illustrated embodiment, the target surface 180 comprises a plurality of surface fins 182 that orthogonally extend from the target surface 180. The surface fins 182 are arranged to be spaced between rows (or columns) of jet orifices 125, as shown in FIG. 11. The surface fins 182 increase the surface area in contact with the coolant fluid, thereby increasing heat transfer. Further, the surface fins 182 assist in directing the coolant fluid within a impingement chamber 179 defined by the target surface 180, the jet orifice plate 120 and the tapered portion 153 of the jet plate manifold.

The insulation assembly 190 is configured to receive the target surface 180. In the illustrated embodiment, the insulation assembly 190 includes a recessed area 194 into which the target surface 180 is disposed. The illustrated insulation assembly 190 further includes a device recess 192 that is configured to accept a heat generating device 197, such as a semiconductor device (see FIG. 11). The target surface 180 is thermally coupled to the heat generating device 197. The insulation assembly 190 may further include a notch 193 that allows electrical connections to pass from the heat generating device 197 out of the cooling apparatus 100. The insulation assembly 190 may also include through-holes or blind bores for receiving fasteners to maintain the various components in an assembled state.

The insulation assembly 190 may be fabricated from any non-electrically conductive material capable of withstanding the high operating temperatures of the heat generating device 197. Exemplary materials include, but are not limited to, solidified polymers (e.g., polyether ether ketone ("PEEK")), ceramic materials (e.g., aluminum nitride), and the like.

Referring specifically now to FIG. 11, a cross-sectional, partially transparent view of an assembled cooling apparatus 100 is schematically depicted. A heat generating device 197 is positioned in a device recess 192 of the insulation assembly 190. The target surface 180 is positioned within the recessed area 194. A second surface 173 of the vapor manifold 170 is coupled to the insulation assembly 190 and the target surface 180.

The jet plate manifold 150 is coupled to the first surface 171 of the vapor manifold 170. In some embodiments, a vapor manifold gasket 160 is positioned between the jet plate manifold 150 and the vapor manifold 170 to prevent coolant fluid from leaking between the two components. The jet plate manifold 150 is arranged with respect to the vapor manifold 170 such that the tapered portion 153 is disposed within the vapor manifold opening 172. The tapered portion 153 of the jet plate manifold 150 is offset with respect to the tapered walls 177 of the vapor manifold 170 such that the tapered portion 153 and the tapered walls 177 define a plurality of sloped vapor outlet channels 176. The sloped vapor outlet channels 176 slope outwardly away from an impingement region (i.e., a region at the surface fins 182) and upwardly toward the fluid inlet 102 (i.e., opposing gravity). The sloped vapor outlet channels 176 are aligned with, and fluidly coupled to, the slot channels 157. As described above, the sloped vapor outlet channels 176 take advantage of the buoyancy of the vapor bubbles to guide them away from the impingement region.

The jet orifice plate 120 is positioned within the jet plate manifold channel 161 such that the jet orifice surface 126 contacts, or nearly contacts, the surface fins 182 of the target surface 180. It is noted that, in some embodiments, the target surface 180 does not include surface fins 182. Additionally, the surface fins 182 may have a geometric configuration that is different from that depicted in FIGS. 6 and 11. In the illustrated embodiment, the rows of jet orifices 125 are aligned with respect to the surface fins 182 such that the impingement jets exiting the jet orifices 125 are between adjacent surface fins 182.

The narrow portion 124 of the jet orifice plate 120, the tapered portion 153 of the jet plate manifold 150, and the target surface 180 define an impingement chamber 179 into which the coolant fluid flows after impinging the target surface 180, as described in more detail below.

The inlet-outlet manifold 110 is coupled to the jet plate manifold 150. In some embodiments, a jet plate manifold gasket 140 is positioned between the inlet-outlet manifold 110 and the jet plate manifold 150 to prevent coolant fluid from escaping the cooling apparatus 100. The slot-shaped outlet openings 117 of the inlet-outlet manifold are aligned with the slot channels 157 of the jet plate manifold 150, thereby fluidly coupling the outlet manifold channels 114a-114d of the inlet-outlet manifold 110 to the slot channels 157.

The outlet manifold channels 114a-114d are fluidly coupled to the fluid outlet 104. In the illustrated embodiment, the outlet manifold channel 114c that is closest to the fluid outlet 104 has the largest height, and the outlet manifold channel 114a opposite from the fluid outlet 104 has the smallest height. Each of the outlet manifold channels 114a-114d slope upwardly toward the fluid outlet 104. It is noted that outlet manifold channel 114d is not visible in FIG. 11, and that outlet manifold channel 114d is symmetrically similar to outlet manifold channel 114b. The outlet manifold channels 114a-114d surround the inlet manifold channel 103 near the perimeter of the inlet-outlet manifold 110.

Figure 12:
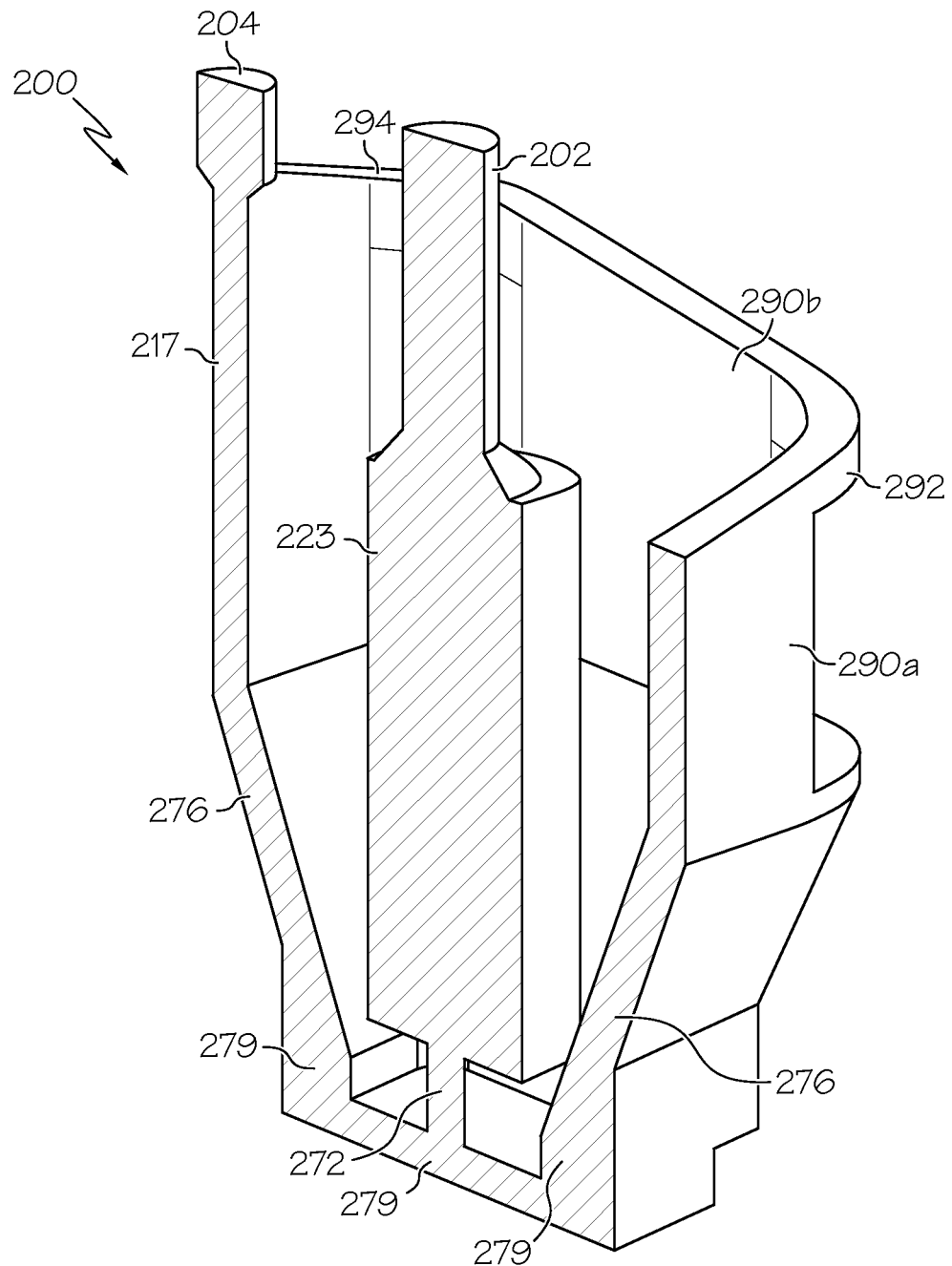
FIG. 12 schematically depicts a fluid domain of coolant fluid flowing within the cooling apparatus depicted in FIG. 11.

Referring now to FIGS. 11 and 12, coolant fluid flowing through the cooling apparatus 100 will now be described. FIG. 12 schematically depicts a cross section of the fluid domain 200 of coolant fluid (in the form of liquid and vapor) flowing through the cooling apparatus 100. Coolant fluid enters the fluid inlet 102 and the inlet manifold channel 103 as indicated by arrow 133a, and fluid region 202 of FIG. 12. The coolant fluid may originate from a coolant fluid reservoir. The coolant fluid flows from the inlet-outlet manifold 110 into the jet channel 123, as indicated by arrows 133b and 133c, as well as fluid region 223 of FIG. 12. The coolant fluid then flows through the jet orifices 125 as an array of impingement jets between adjacent surface fins 182 (represented generically by fluid region 272). Because of the non-uniform sizes of the jet orifices 125 of the jet orifice surface 126, each impingement jet impinges the target surface 180. In embodiments, the jet orifices 125 are sized such that the impingement jets impinge the target surface 180 at substantially the same velocity. In other embodiments, the jet orifices 125 are sized such that the impingement jets impinge the target surface 180 at different velocities according to a desired impingement velocity pattern. The coolant fluid flows between and around the surface fins 182 toward a perimeter of the impingement chamber 179 as indicated by arrows 133d (fluid region 274 of FIG. 12). Due to the high operating temperature of the heat generating device 197, some of the coolant fluid changes from a liquid to a vapor. Accordingly, vapor bubbles form within the impingement chamber. Body forces and buoyant forces direct the coolant fluid (both liquid and vapor bubbles) into the sloped vapor outlet channels 176 as indicated by arrows 133e and 133f (fluid region 276 of FIG. 12). It is noted that coolant fluid flows through all four sloped vapor outlet channels 176, and that only two arrows (arrows 133e, 133f) are depicted for ease of illustration. The sloped vapor outlet channels 176 take advantage of the buoyancy of the vapor bubbles to guide them away from the surface fins 182 and the impingement region.

The coolant fluid then flows from the sloped vapor outlet channels 176 into the slot channels 157 of the jet plate manifold 150 as indicated by arrows 133g and 133f, wherein it flows upward and into the outlet manifold channels 114a-114d of the inlet-outlet manifold 110. Referring to FIG. 12, the coolant fluid flowing within the slot channels 157 and the outlet channels 114a-114d are combined into individual flow regions 290a-290c for ease of illustration. It is noted that a fourth fluid region 290d is not depicted in FIG. 12, and is symmetrically similar to fluid region 290b.

A top portion of each of the fluid regions 290a-290d slope upwardly toward the fluid outlet. Fluid region 290a is the shortest of the four fluid regions 290a-290d, and slopes upwardly toward fluid region 290b and 290d (not shown). Fluid region 290c is the tallest of the four fluid regions 290a-290d and is closest to the fluid outlet, which is indicated by fluid region 204 in FIG. 12. A bridge channel indicated by bridge fluid region 292 fluidly couples fluid region 290a to fluid region 292b. In other words, outlet manifold channels 114a and 114b are fluidly coupled by an internal bridge channel 118a (FIG. 11). Similarly, outlet manifold channels 114a and 114d are fluidly coupled by a bridge channel (not shown) that is symmetrically similar to internal bridge channel 118a. Coolant fluid flowing through internal bridge channel 118a is indicated by arrow 133h in FIG. 11.

Coolant fluid flowing up within outlet manifold channels 114b and 114d through slot channels 157, as well as coolant fluid entering from outlet manifold channel 114a, flows upwardly toward outlet manifold channel 114c as indicated by arrow 133i. Accordingly, FIG. 12 depicts the fluid region 290b that slopes upwardly toward fluid region 290c. Outlet manifold channel 114b is fluidly coupled to outlet manifold channel 114c by an internal bridge channel 118b. Thus, coolant fluid flows from outlet manifold channel 114b into outlet manifold channel 114c through the internal bridge channel 118b as indicated by arrow 133j. FIG. 12 depicts a bridge fluid region 294 that fluidly couples fluid region 290b to fluid region 290c. It is noted that outlet manifold channel 114d (not shown) is also fluidly coupled to outlet manifold channel 114c by an internal bridge channel that is symmetrically similar to internal bridge channel 118b.

Coolant fluid flowing from the slot channel 157 aligned with outlet manifold channel 114c, as well as coolant fluid entering out outlet manifold channel from the other outlet manifold channels 114b-114d, flow upwardly toward the fluid outlet 104 as indicated by 133k. The coolant fluid then exits the cooling apparatus through the fluid outlet 104. Coolant fluid within the fluid outlet 104 is depicted as fluid region 204 in the fluid domain 200 of FIG. 12.

It should now be understood that embodiments described herein are directed to jet impingement cooling apparatuses having non-uniformly sized jet orifices for enhanced thermal performance. The non-uniformly sized jet orifices are sized to ensure that each impingement jet of an array of impingement jets directly impinge the target surface being cooled despite regions of low pressure within the impingement chamber due to one or more fluid outlets. Direct impingement of each impingement jet may increase heat transfer by convection and minimize cross flow of coolant fluid across the target surface.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A cooling apparatus comprising:
at least one fluid inlet channel;
at least one fluid outlet channel;
a target surface; and
a jet orifice surface that is offset from the target surface and comprising an array of jet orifices fluidly coupled to the at least one fluid inlet channel, wherein each individual jet orifice of the array of jet orifices has an area corresponding to a distance of the individual jet orifice to the at least one fluid outlet channel such that individual jet orifices closer to the at least one fluid outlet channel have an area that is smaller than individual jet orifices further from the at least one fluid outlet channel.

2. The cooling apparatus of claim 1, wherein the array of jet orifices are configured such that coolant fluid within the fluid inlet channel flows through the array of jet orifices as an array of impingement jets comprising individual impingement jets that impinge the target surface at substantially equal fluid velocity.

3. The cooling apparatus of claim 2, wherein the individual jet orifices of the array of jet orifices are sized such that each individual impingement jet of the array of impingement jets orthogonally impinge the target surface.

4. The cooling apparatus of claim 1, wherein the area of the individual jet orifices of the array of jet orifices increases radially from a central region of the array of jet orifices.

5. The cooling apparatus of claim 1, wherein the at least one fluid outlet channel comprises four fluid outlet channels positioned above the target surface and about a perimeter of the cooling apparatus such that the area of the individual jet orifices decreases radially from a central region of the array of jet orifices.

6. The cooling apparatus of claim 1, wherein the area of the individual jet orifices of the array of jet orifices decreases asymmetrically.

7. The cooling apparatus of claim 1, wherein each individual jet orifice of the array of jet orifices is circular.

8. The cooling apparatus of claim 1, further comprising an insulation assembly and a semiconductor device coupled to the insulation assembly and the target surface.

9. The cooling apparatus of claim 1, wherein the array of jet orifices comprises five rows of jet orifices and five columns of jet orifices defining a central jet orifice having a first area, a first ring of jet orifices surrounding the central jet orifice with each individual jet orifice of the first ring of jet orifices having a second area, and a second ring of jet orifices surrounding the first ring of jet orifices with each individual jet orifice of the second ring of jet orifices having a third area, and wherein the second area is greater than the third area and the first area is greater than the second area.

10. A cooling apparatus comprising:
at least one fluid inlet channel;
at least one fluid outlet channel;
a target surface; and
a jet orifice surface that is offset from the target surface and comprising an array of jet orifices fluidly coupled to the at least one fluid inlet channel, wherein:
the target surface and the jet orifice surface at least in part define an impingement chamber having at least one region of relatively high pressure and at least one region of relatively low pressure having a pressure that is lower than a pressure at the region of relatively high pressure when the coolant fluid flows through the array of jet orifices; and
each individual jet orifice of the array of jet orifices has an area such that individual jet orifices proximate the at least one region of relatively low pressure have an area that is smaller than individual jet orifices proximate the at least one region of relatively high pressure.

11. The cooling apparatus of claim 10, wherein the array of jet orifices are configured such that coolant fluid within the fluid inlet channel flows through the array of jet orifices as an array of impingement jets comprising individual impingement jets that impinge the target surface at substantially equal fluid velocity.

12. The cooling apparatus of claim 10, wherein the area of each individual jet orifice of the array of jet orifices increases radially from a central region of the array of jet orifices.

13. The cooling apparatus of claim 10, wherein the at least one fluid outlet channel comprises four fluid outlet channels positioned above the target surface and about a perimeter of the cooling apparatus such that the area of the individual jet orifices decreases radially from a central region of the array of jet orifices.

14. The cooling apparatus of claim 10, wherein the area of the individual jet orifices of the array of jet orifices decreases asymmetrically.

15. The cooling apparatus of claim 10, wherein the array of jet orifices comprises five rows of jet orifices and five columns of jet orifices defining a central jet orifice having a first area, a first ring of jet orifices surrounding the central jet orifice with each individual jet orifice of the first ring of jet orifices having a second area, and a second ring of jet orifices surrounding the first ring of jet orifices with each individual jet orifice of the second ring of jet orifices having a third area, wherein the second area is greater than the third area and the first area is greater than the second area.

\* \* \* \* \*